(12) United States Patent
Pierrel et al.

(10) Patent No.: US 8,148,754 B2
(45) Date of Patent: *Apr. 3, 2012

(54) LOW RESISTANCE INTEGRATED MOS STRUCTURE

(75) Inventors: Maud Pierrel, Istres (FR); Bilal Manai, Aix en Provence (FR)

(73) Assignee: Atmel Rousset S.A.S., Rousset (FR)

( * ) Notice: Subject to any disclaimer, the term of this patent is extended or adjusted under 35 U.S.C. 154(b) by 565 days.

This patent is subject to a terminal disclaimer.

(21) Appl. No.: 12/135,956

(22) Filed: Jun. 9, 2008

(65) Prior Publication Data

US 2009/0302393 A1 Dec. 10, 2009

Related U.S. Application Data

(63) Continuation of application No. 11/416,115, filed on May 2, 2006, now Pat. No. 7,385,263.

(51) Int. Cl.
*H01L 29/00* (2006.01)
(52) U.S. Cl. ........ 257/202; 257/206; 257/355; 257/192; 257/288; 257/328; 257/401; 257/103; 257/300; 257/E29.001
(58) Field of Classification Search .............. 257/202, 257/206, 355, 192, 288, 316, 328, 401, 103, 257/300, E29.001, E27.013
See application file for complete search history.

(56) References Cited

U.S. PATENT DOCUMENTS

| | | | |
|---|---|---|---|
| 5,493,142 A | 2/1996 | Randazzo et al. | |
| 6,400,003 B1 | 6/2002 | Huang | |
| 6,580,137 B2 | 6/2003 | Parke | |
| 6,693,140 B2 | 2/2004 | Shiromoto et al. | |
| 6,822,285 B1 | 11/2004 | Lojek | |
| 6,888,197 B2 | 5/2005 | Ni et al. | |
| 6,972,464 B2 | 12/2005 | Shen | |
| 7,385,263 B2 * | 6/2008 | Pierrel et al. .................. | 257/401 |
| 2003/0102494 A1 | 6/2003 | Akamine et al. | |
| 2004/0119117 A1 | 6/2004 | Kushida | |
| 2004/0206990 A1 | 10/2004 | Liao et al. | |
| 2007/0257278 A1 | 11/2007 | Pierrel et al. | |

OTHER PUBLICATIONS

"AND8044/D Single-Channel 1206A ChipFET Power MOSFET Recommended Pad Pattern and Thermal Performance", *Semiconductor Components Industries*, (Feb. 2001).
"Application Note AN-7501: Switching Waveforms of the L2FET: A Volt Gate-Drive Power MOSFET", *Fairchild Semiconductor Corporation*, (2002).
Gui, Peggy (Ping), "EE5356/7356 VLSI Design and Lab Fall 2004", *Lecture 03:MOSFET*, (Aug. 26, 2004).
Li, et al., "AN1030 Design With MOSFET Load Switch", (Oct. 1998).
Mathew, L., et al., "Vertical CMOS Double Gate MOSFET with Notched Poly Gates".

* cited by examiner

*Primary Examiner* — Cuong Q Nguyen
*Assistant Examiner* — Tran Tran
(74) *Attorney, Agent, or Firm* — Fish & Richardson P.C.

(57) ABSTRACT

The present invention is related to a metal-oxide semiconductor field-effect transistor (MOSFET) having a symmetrical layout such that the resistance between drains and sources is reduced, thereby reducing power dissipation. Drain pads, source pads, and gates are placed on the MOSFET such that the distances between drains, sources, and gates are optimized to reduce resistance and power dissipation. The gates may be arranged in a trapezoidal arrangement in order to maximize a ratio of the gate widths to gate lengths for current driving while reducing resistance and power dissipation.

20 Claims, 13 Drawing Sheets

LOW RESISTANCE INTEGRATED MOS STRUCTURE

RELATED APPLICATIONS

This application is a continuation of U.S. patent application Ser. No. 11/416,115, filed May 2, 2006.

FIELD OF INVENTION

The present invention is related to metal-oxide semiconductor field-effect transistors (MOSFETs). More particularly, the present invention is related to reducing resistance and power dissipation in a power MOSFET.

BACKGROUND

There has been a trend towards integrating previously off-chip circuits onto a single integrated circuit (IC), particularly in mobile devices. Such ICs are sometimes called system-on-chip (SoC) solutions and may include components such as high power metal-oxide semiconductor field-effect transistors (MOSFETs) used for driving circuits, buffers, amplifiers, or the like. The use of high power MOSFETs is limited to low driving currents, since power consumption on an IC is limited, particularly for mobile applications. However, higher driving currents are desired. Since power MOSFETs typically occupy more space on an IC than normal MOSFETs, space on the IC must also effectively be allocated.

FIG. 1 shows an example of a conventional complementary metal-oxide semiconductor (CMOS) layout 100 comprising an n-type metal-oxide semiconductor (NMOS) transistor 110 and a p-type metal-oxide semiconductor (PMOS) transistor 120. CMOS transistors are a particular type of MOSFET. An n-type MOSFET is one in which a conduction channel is formed by electrons and a p-type MOSFET is one in which a conduction channel is formed by holes. In FIG. 1, the NMOS 110 and PMOS 120 transistors share a common polysilicon gate 130 and lay on a common p-type substrate 140. The NMOS transistor 110 and PMOS transistor 120 may also have separate polysilicon gates, as desired. The NMOS transistor 110 is constructed by implanting two "n+" layers 150 for the drain and source in the p-type substrate 140. The PMOS transistor 120 is constructed by implanting two "p+" layers 160 in an implanted n-well region 170. The n+ layer 150 represents a large number of free negative carriers, whereas the p+ layer 160 represents a larger number of free positive carriers available for conduction. The n-well 170 is created by an impurity implantation into the p-type substrate 140. A gate oxide layer 190 typically exists between the polysilicon gate 130 and p-type substrate 140 or n-well region 170. The NMOS transistor 110 and PMOS transistor 120 are separated by an insulting silicon dioxide ($SiO_2$) layer 180.

In the CMOS layout 100, the current driving capability of the transistors is described by the relationship in Equation(1) as follows:

$$I_{ds} \propto \frac{W}{L}; \quad \text{Equation (1)}$$

where $I_{ds}$ is the current between the drain and source of the transistors 110 and 120, W is the width of the polysilicon gate 130 over the active area, and L is the length of the polysilicon gate 130 over the active area. Therefore, in order to provide higher driving currents for power applications, it is desirable to have a transistor with a higher W and lower L.

FIG. 2 shows an example of a conventional PMOS transistor circuit 200. Various resistors, which may be parasitic resistors, are created by the layers and the interconnection between layers of the PMOS transistor 200. In the source 201, $R_{spad}$ 210 is the source pad resistance, $R_{slayer}$ 220 is the resistance of layers connecting a pad to a source region, and $R_{ds}$ 230 is the drain to source MOSFET resistance. In the drain 202, $R_{dlayer}$ 240 is the resistance of layers connecting a drain region to a pad, and $R_{dpad}$ 250 is the drain pad resistance. $R_{ON}$ 260 is the total resistance calculated by Equation (2) as follows:

$$R_{ON} = R_{spad} + R_{slayer} + R_{ds} + R_{dpad} + R_{dlayer}. \quad \text{Equation(2)}$$

An NMOS transistor, not shown, has similar resistance characteristics.

The power dissipated by the PMOS transistor 200 is calculated by Equation (3) as follows:

$$P = R_{ON} I_{ds}^2. \quad \text{Equation (3)}$$

Similar to Equation(1), $I_{ds}$ is the current flow through the PMOS transistor 200 from the drain pad to the source pad. The source and drain pins in 200 are possible connection points to the pads, as desired. Therefore, the power dissipated is closely related to the total resistance $R_{ON}$ 260. Since $I_{ds}$ of a power MOSFET is typically high, it is desired to reduce power dissipation by reducing $R_{ON}$ 260. Of the resistances in Equation(2), $R_{ds}$ 230 may be reduced by taking into consideration the layout of the PMOS transistor 200.

FIG. 3 shows a layout of a conventional power MOSFET 300. The MOSFET 300 comprises drain and source pads $310_1, 310_2, \ldots 310_M$, drain regions 320, source regions 330, a plurality of gates 340, and a plurality of VIAs 350. The pads $310_1, 310_2, \ldots 310_M$ may be used for signal input/outputs (I/O) or for supplying power to the MOSFET 300, as desired. A plurality of gates 340 is needed in order to provide higher driving currents, in accordance with Equation(1). A VIA is typically needed to interconnect different metal layers on the MOSFET 300. The $R_{ds}$ value of MOSFET 300 is related to the placement of the gates relative to the drain and source pads.

Conventional MOSFETs, such as MOSFET 300, are often inefficient due to the increasing distances between the drain pads and source pads relative to the active regions. Referring still to MOSFET 300 as an example, the distance between source pad $310_1$ to drain pad $310_M$ relative to the active region 360 is greater than the distance between source pad $310_3$ and drain pad $310_4$ relative to the active region 362. The increased distance between source pad $310_1$ to drain pad $310_M$ may result in poor biasing and driving currents of active region 360.

In view of the above, a need exists for reducing power dissipation in MOSFETs without the limitations of the prior art.

SUMMARY

The present invention is related to a metal-oxide semiconductor field-effect transistor (MOSFET) having a substantially symmetrical layout such that the resistance between drains and sources is reduced, thereby reducing power dissipation. Drain pads, source pads, and gates are selectively placed on the MOSFET such that the distances between drains, sources, and gates are optimized to reduce resistance and power dissipation.

BRIEF DESCRIPTION OF THE DRAWINGS

A more detailed understanding of the invention may be had from the following description, given by way of example and to be understood in conjunction with the accompanying drawings, wherein.

DETAILED DESCRIPTION OF THE PREFERRED EMBODIMENTS

Figure 1:
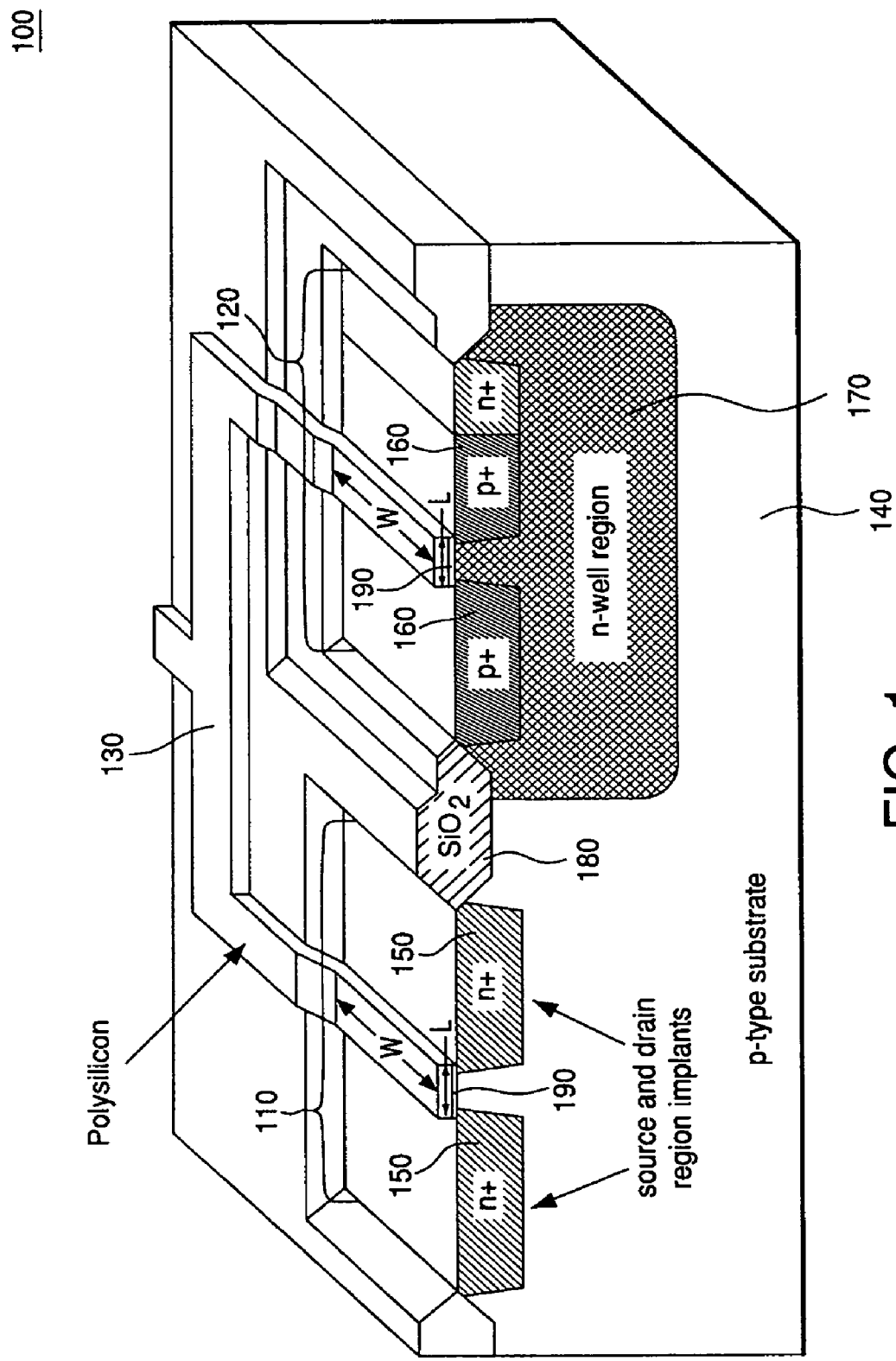
FIG. 1 is an example of a conventional complementary metal-oxide semiconductor (CMOS) transistor.
Figure 2:
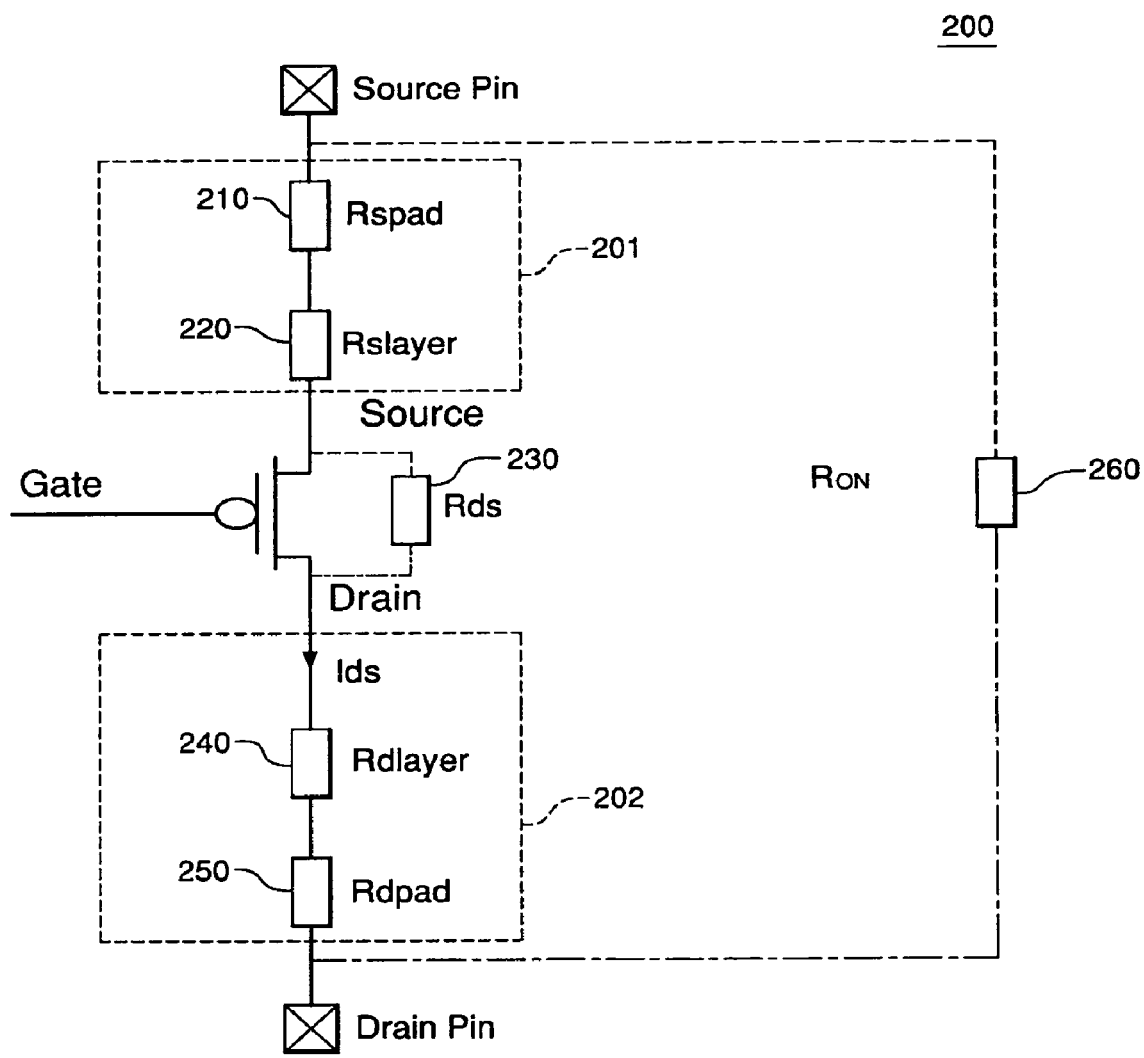
FIG. 2 is an example of a conventional p-type metal-oxide semiconductor (PMOS) transistor circuit.
Figure 3:
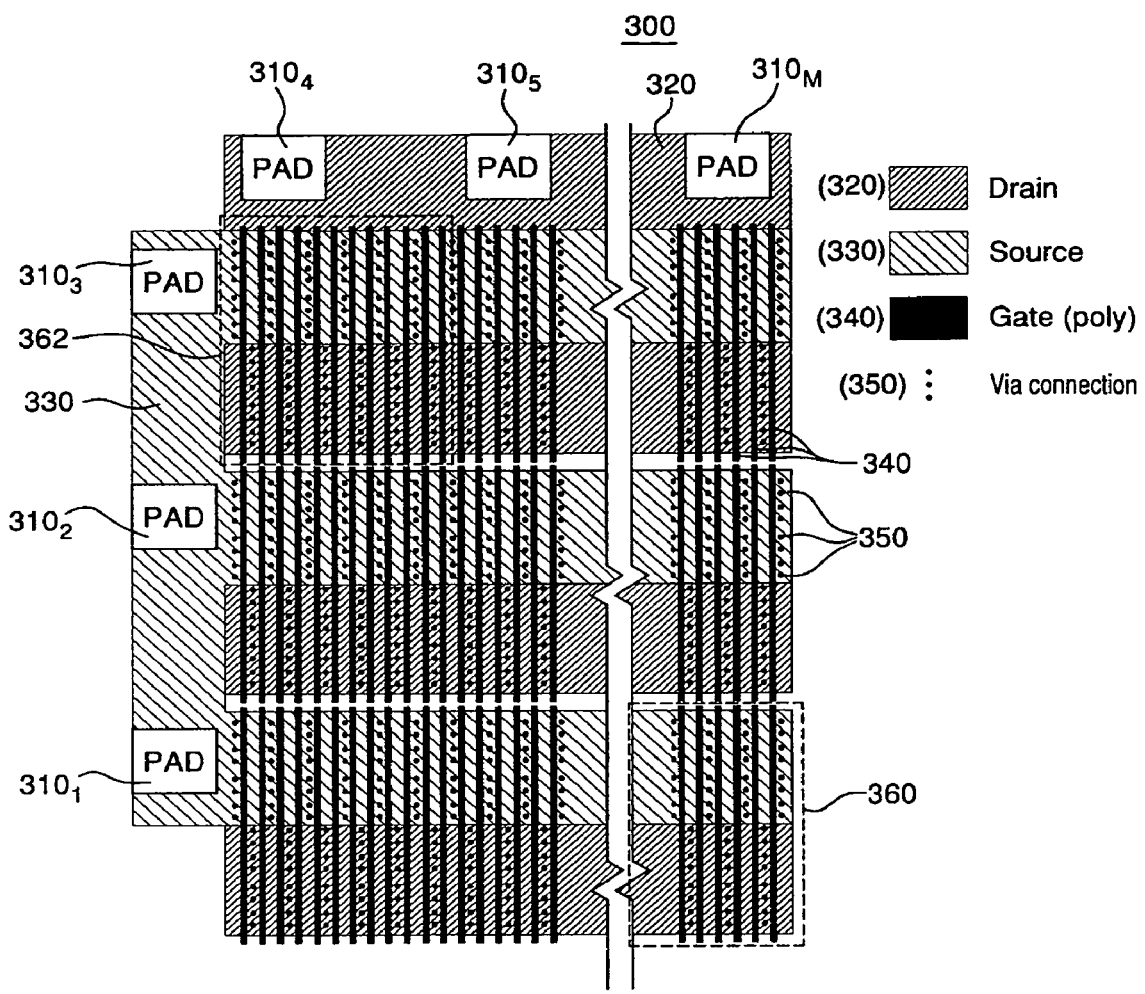
FIG. 3 is an example of a conventional power metal-oxide semiconductor field-effect transistor (MOSFET) layout.

The present invention will be described with reference to the drawing figures wherein like numerals represent like elements throughout.

The present invention provides an efficient layout of a metal-oxide semiconductor field-effect transistor (MOSFET) by having a substantially symmetric layout characteristic for reducing $R_{ON}$ and power dissipation, thereby allowing the use of higher driving currents for higher power applications. For purposes of describing the present invention, substantially symmetric and/or substantially symmetrical may be used interchangeably and may mean that the structure is not symmetric due to precision and/or accuracy limitations of MOSFET processing techniques or any other issues related thereto.

The present invention, purely by way of example, may be incorporated in portable devices, battery chargers, low-dropout regulators, DC-DC converters and power amplifiers. The present invention may be implemented in any type of device where a reduction in power dissipation is desired.

It is noted that the figures included herein are provided as representations of mask works for purposes of describing the invention and may not necessarily be to scale. In the present invention, mask works have been laid out approximately according to mask work or process design rules, which may change.

Figure 4:
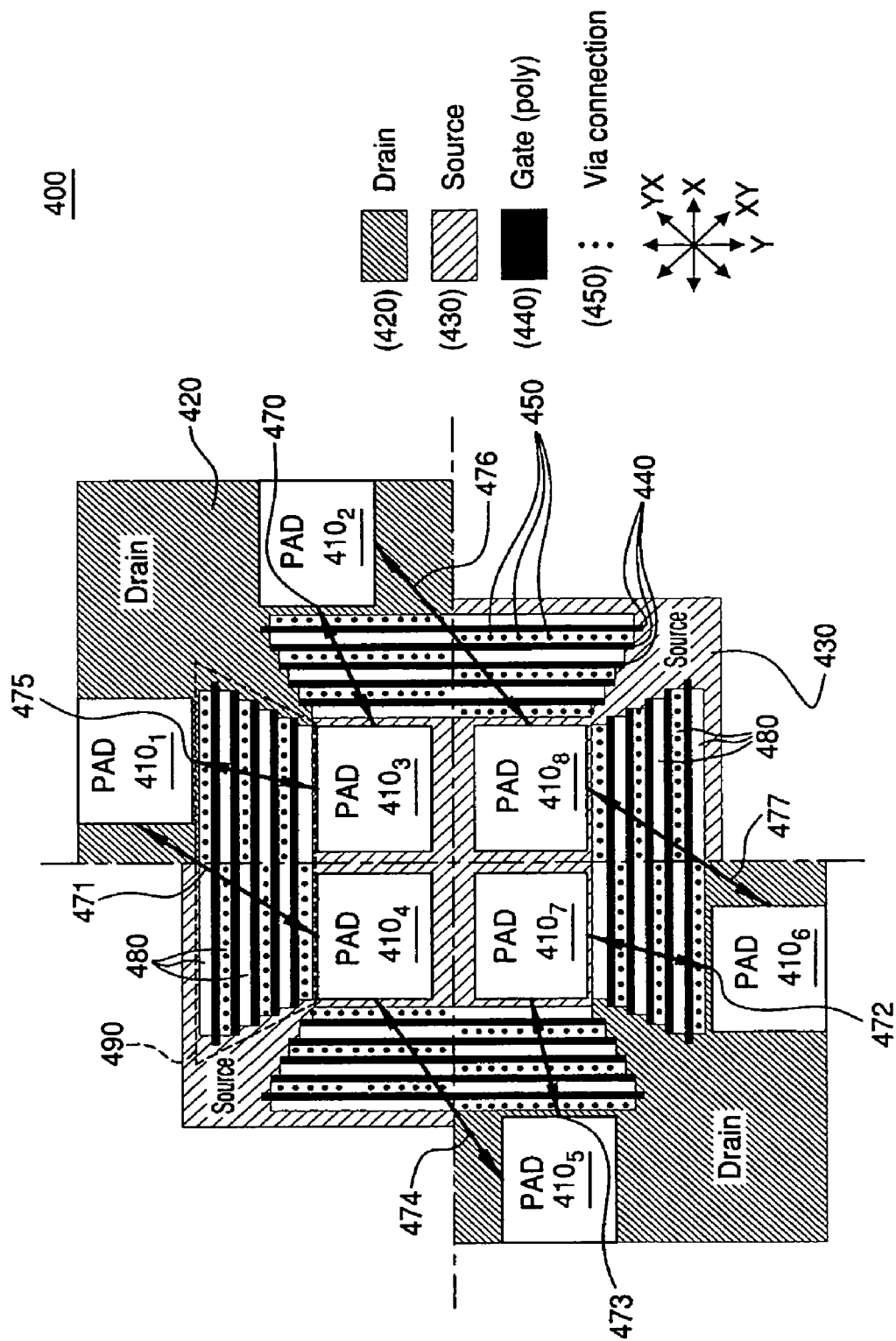
FIG. 4 is a MOSFET having a substantially symmetrical layout including a total of eight drain and source pads arranged about the XY-axis and YX-axis in accordance with the present invention.

FIG. 4 shows a MOSFET 400 having a substantially symmetric layout in accordance with the present invention. The MOSFET 400 comprises a drain 420 and source 430 (i.e. drain and source regions) comprising a plurality of drain and source pads $410_1$ to $410_8$. Although MOSFET 400 is shown to have an equal number of drain and source pads, the number of drain pads may be different than the number of source pads, as desired. The total number of pads may be related to the current driving needs of the MOSFET 400. The MOSFET 400 further comprises a plurality of gates 440 and a plurality of VIAs 450. The size and placement of the PADS $410_1$ to $410_8$, plurality of gates 440, and VIAs 450 may be dependent on process design rules. The plurality of VIAs 450 may be used to couple different metal layers of the drain 420 and source 430.

The plurality of gates 440 lay on active areas 480 and form four substantially trapezoidal arrangements (e.g. 490) around each collection of gates. For purposes of describing the present invention, substantially trapezoidal may mean that the structure is not trapezoidal due to precision, accuracy, and/or design rules limitations of MOSFET processing techniques or that the W/L value of each gate in the trapezoidal arrangement may be varied. The substantially trapezoidal arrangement may be an isosceles trapezoidal arrangement or any other type of trapezoidal arrangement, as desired. The substantially trapezoidal arrangement 490 helps to maximize the W/L ratio of the MOSFET 400 while minimizing the distances 470 to 477 between pads and active regions for reducing RON between drain and source pads $410_1$ to $410_8$. The distances 470 to 477 between pads and active regions are shown as a convenient graphical example of the relationship between drain and source pads distances to $R_{ON}$. The distances between the drain pads to the active regions or areas 480 and the source pads to the active regions or areas 480 may be a better representation of the relationship to $R_{ON}$. The higher W/L ratio of the MOSFET 400 help to provide higher driving currents, in accordance with Equation(1).

Still referring to FIG. 4, the number of gates 440 in substantially trapezoidal arrangements (e.g. 490) may be changed and may depend on the current driving needs and available chip space. As a result of the substantially symmetric layout, the MOSFET 400 has improved biasing characteristics, thereby improving electromigration effects and increased reliability. As desired, the MOSFET 400 may be an n-type metal-oxide semiconductor (NMOS) or p-type metal-oxide semiconductor (PMOS) transistor. The MOSFET 400 may be used multiple times to form a larger circuit, such as for very large scale integration (VLSI) applications, and may be coupled to other MOSFET structures.

Figure 5:
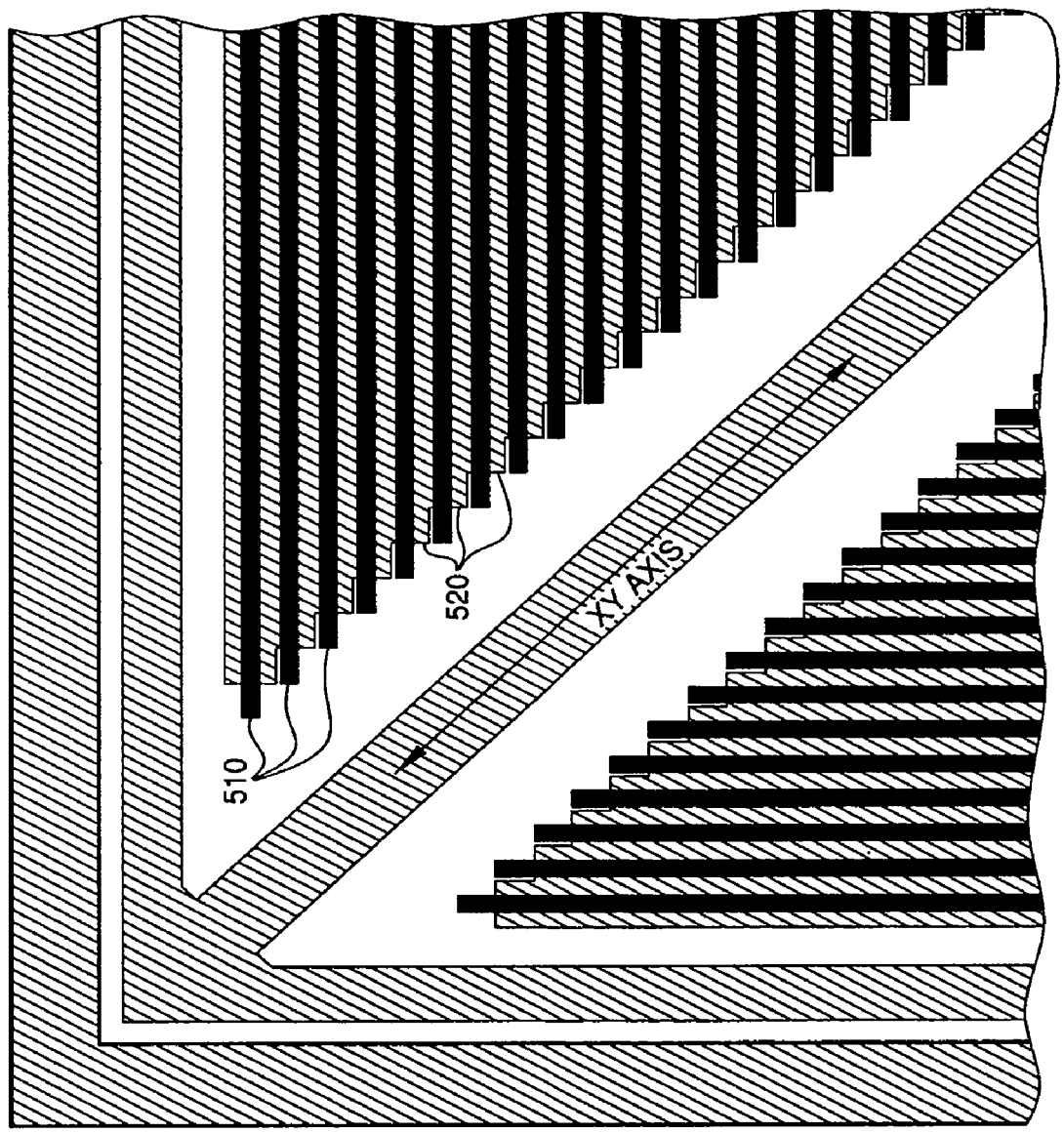
FIG. 5 is a partial view of a substantially symmetric layout of gates and active areas of a MOSFET 500 in accordance with an embodiment of the present invention.

FIG. 5 shows a partial view of a substantially symmetric layout of gates and active areas of a MOSFET 500 in accordance with an embodiment of the present invention. In MOSFET 500, a plurality of gates 610 lay on the active area 520. The MOSFET 500 is substantially symmetric about an XY-axis. The substantially symmetric layout of the MOSFET 500 helps to maximize the W/L ratios of the gates 510, thereby providing higher driving currents for higher power applications. A similar type of substantial symmetry exists about the YX-axis. It is noted that this layout may exist in any of the MOSFETs shown and described herein.

Figure 6:
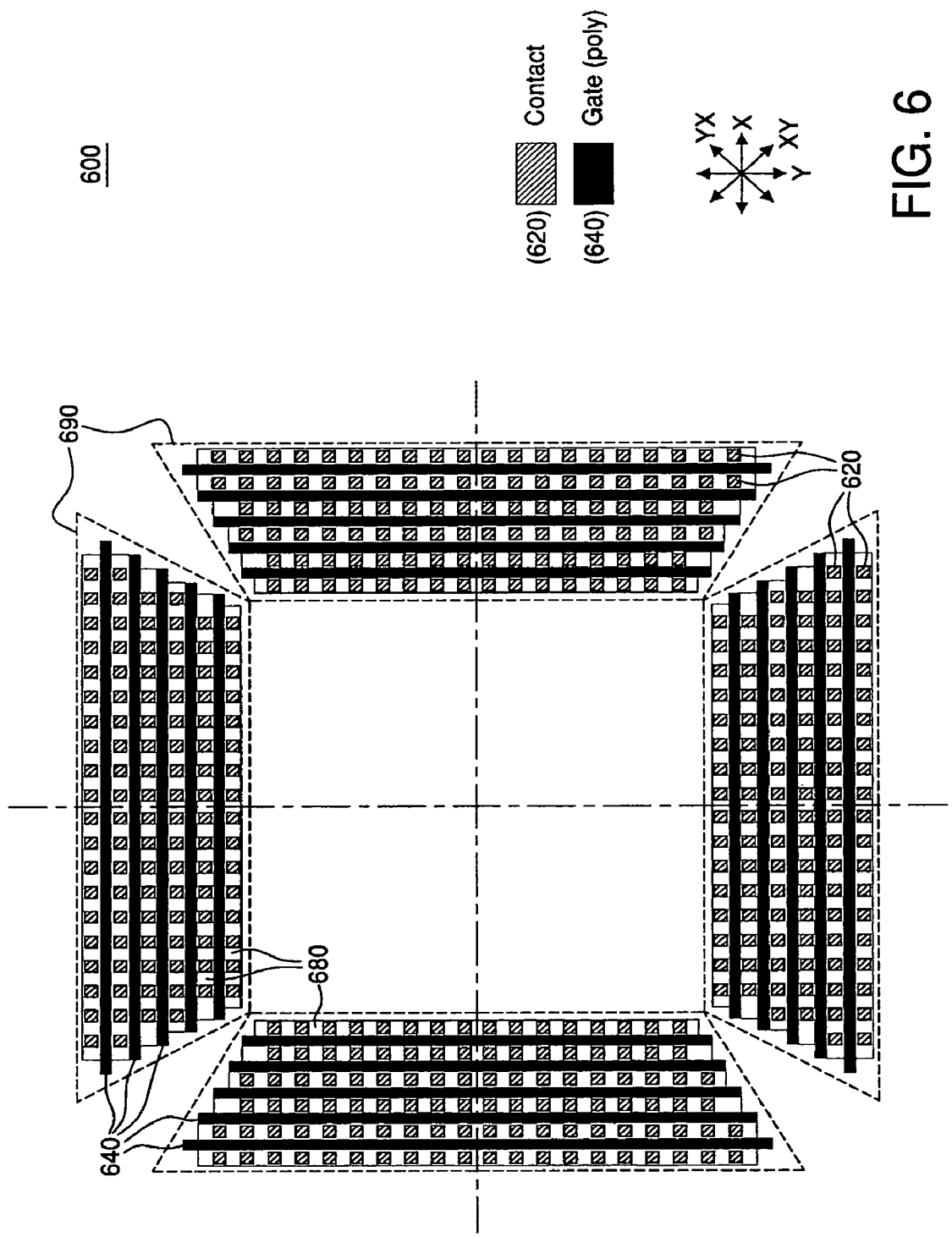
FIG. 6 is a MOSFET having substantial symmetry about the X, Y, XY and YX-axes in accordance with the present invention.

FIG. 6 shows a MOSFET 600 in accordance with an embodiment of the present invention. In MOSFET 600, a plurality of gates 640 have a substantially trapezoidal arrangement 690. A plurality of drain and source contacts 620 are arranged in active areas 680. The layout 600 shows that substantial symmetry may exist about the X,Y, XY and YX-axes.

A comparison may be made between the measured RON values of a conventional MOSFET layout 300 and MOSFET 400 in accordance with the present invention. Using similar W/L values for MOSFET layouts 300 and 400, Table 1 shows post layout simulation results using similar parameters for both layouts each implemented as an NMOS transistor. Using an embodiment of the present invention, the $R_{ON}$ is substantially decreased for MOSFET 400.

TABLE 1

| MOSFET | W/L | MAX POWER | CURRENT | MAX Target $R_{ON}$ | MEASURED $R_{ON}$ |
|---|---|---|---|---|---|
| NMOS (layout 300) | Constant | 400 mW | 1 Amperes | 400 mΩ | 408 mΩ |
| NMOS (layout 400) | Constant | 400 mW | 1 Amperes | 400 mΩ | 104.5 mΩ |

Figure 7:
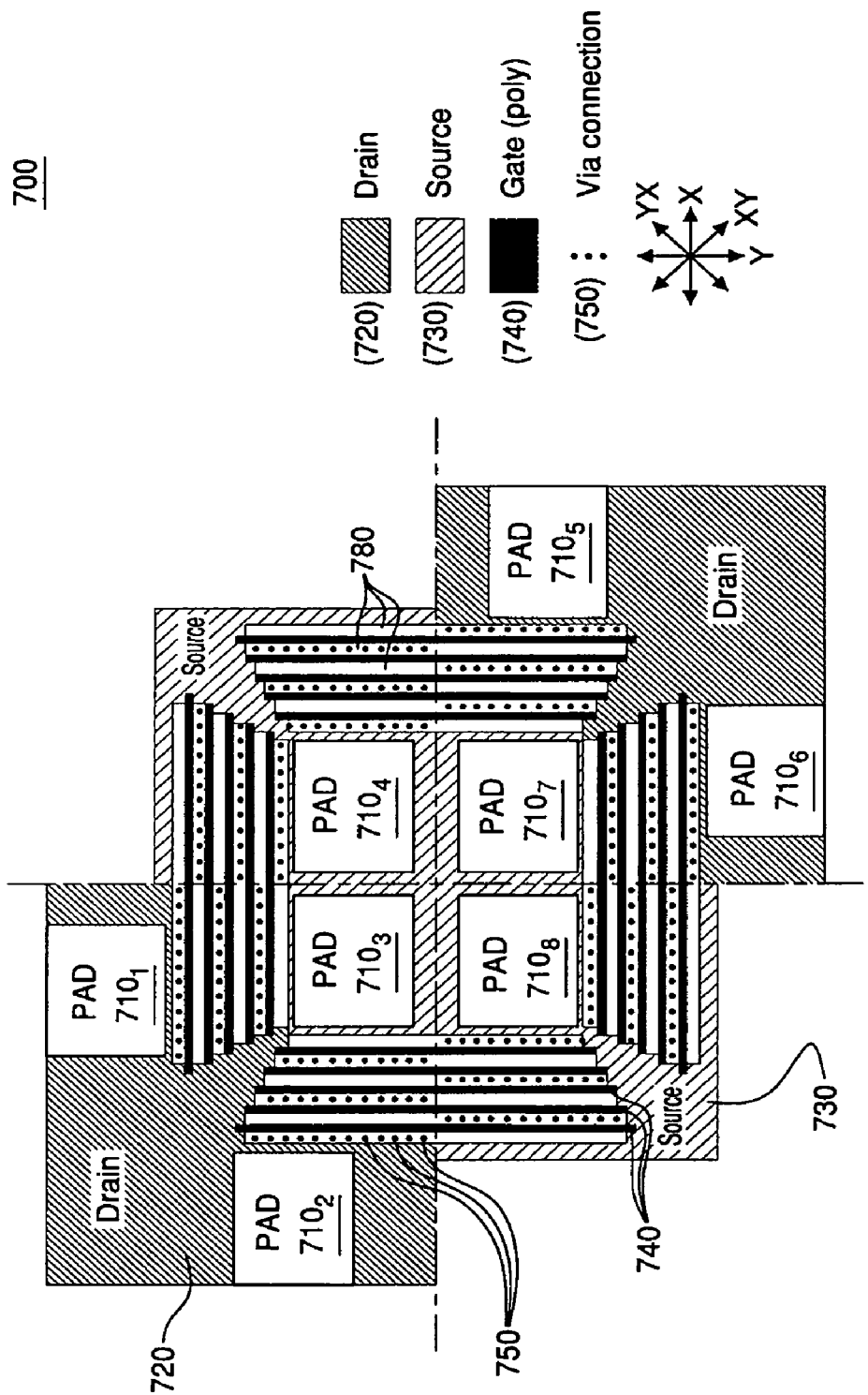
FIG. 7 is an embodiment of a MOSFET having a substantially symmetrical layout including a total of eight drain and source pads arranged about the XY-axis and YX-axis in accordance with the present invention.

FIG. 7 shows a MOSFET 700 having a substantially symmetric layout in accordance with an embodiment of the present invention. Similar to the MOSFET 400 of FIG. 4, MOSFET 700 is symmetric about the XY and YX axes. The MOSFET 700 comprises a drain 720 and source 730 comprising a plurality of pads $710_1$ to $710_8$ arranged about an XY-axis. The MOSFET 700 may have any number of drain pads, source pads, and gates, as desired. The MOSFET 700 comprises a plurality of gates 740 and a plurality of VIAs 750. The plurality of gates 740 lay on active areas 780. The gates 740 help to maximize the W/L ratio of the MOSFET 700 in order to provide higher driving currents, in accordance with Equation(1). The placement of the gates 740 in the MOSFET 700 also help to minimize the distance between drain and source pads $710_1$ to $710_8$ to the active areas 780, thereby reducing $R_{ON}$ and power dissipation. As desired, MOSFET 700 may be an NMOS or PMOS transistor.

Figure 8A:
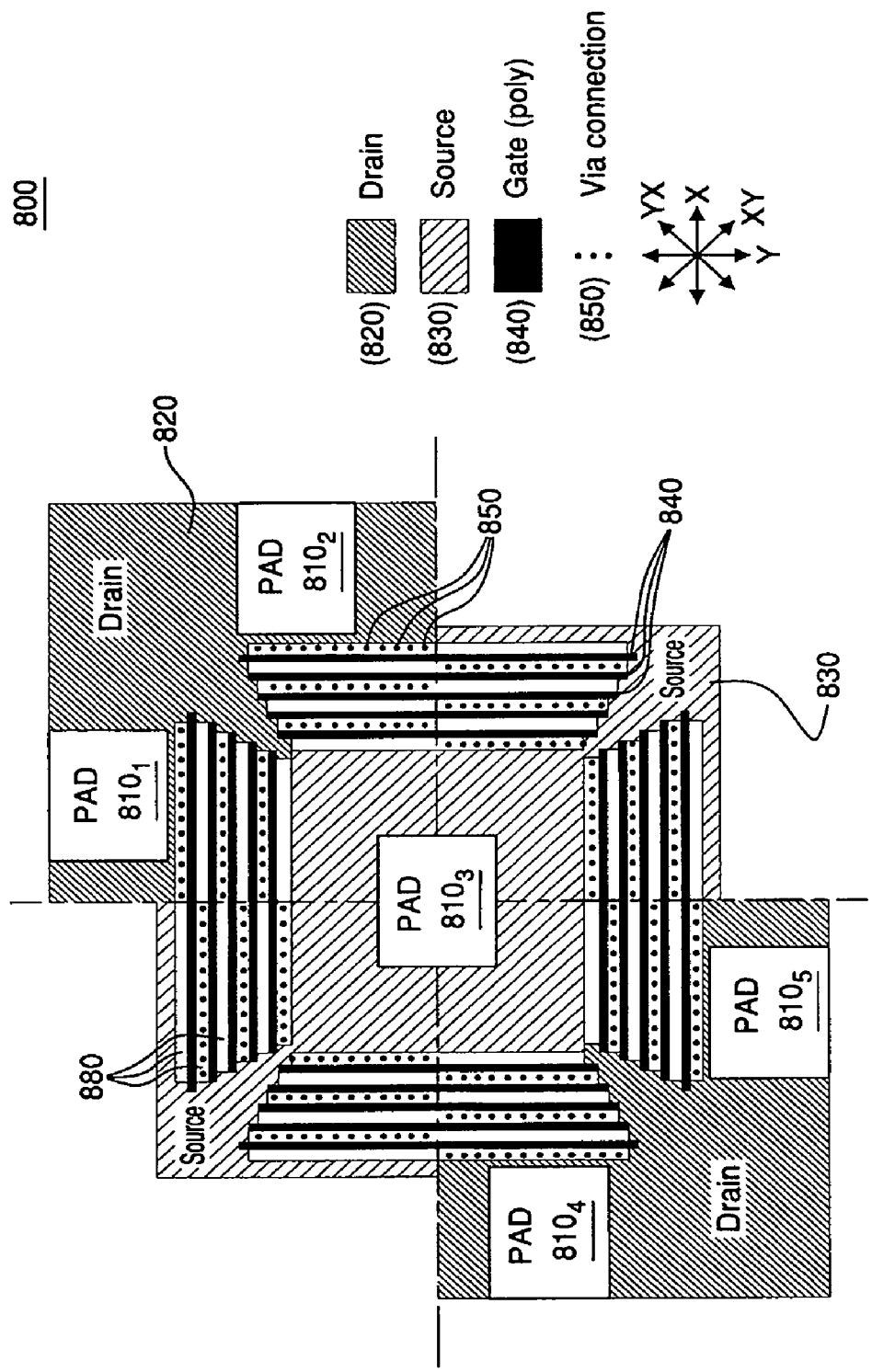
FIG. 8A is an embodiment of a MOSFET having a substantially symmetrical layout including a total of five drain and source pads arranged about the XY-axis and YX-axis in accordance with the present invention.
Figure 8B:
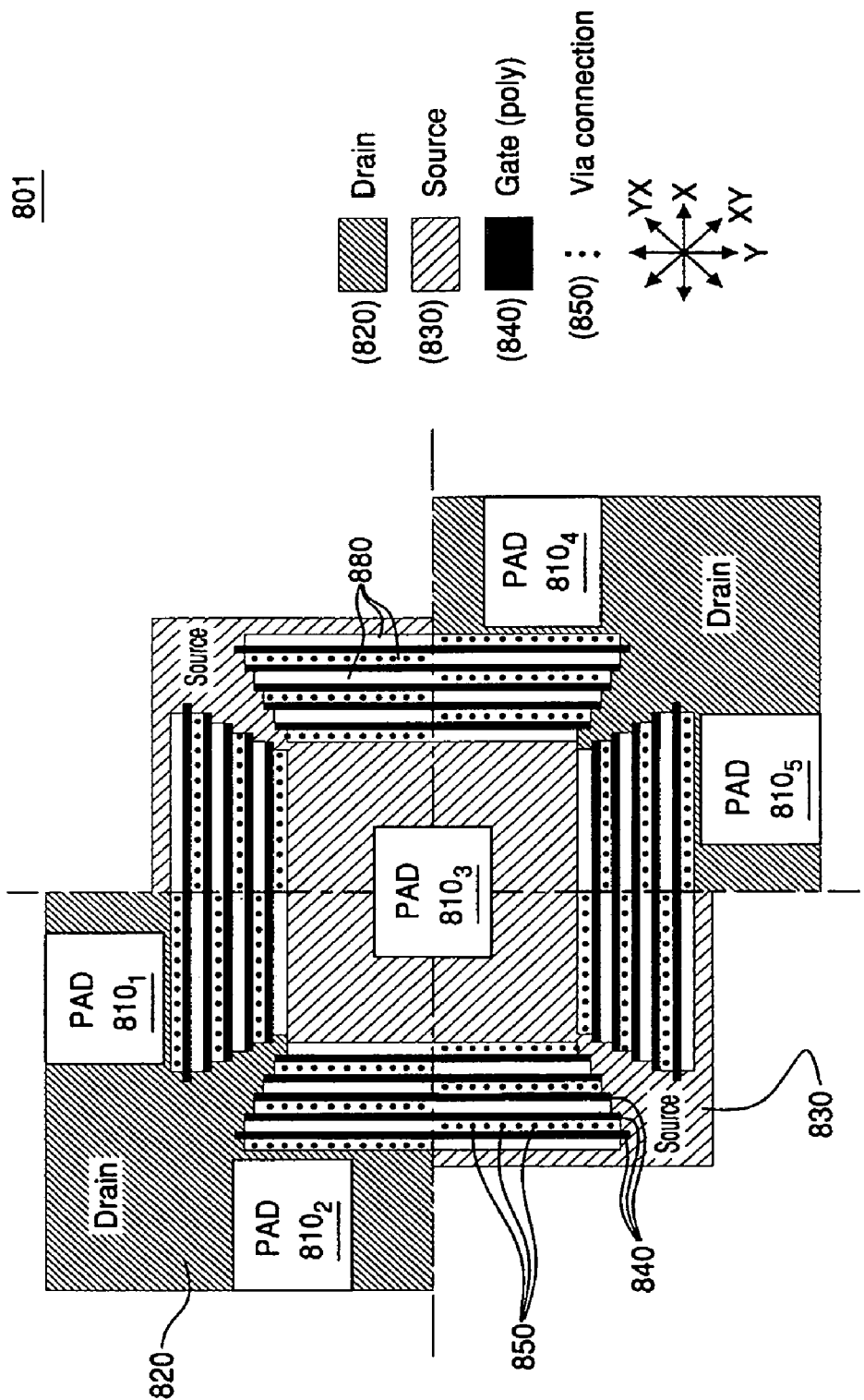
FIG. 8B is an embodiment of a MOSFET having a substantially symmetrical layout including a total of five drain and source pads arranged about the XY-axis and YX-axis in accordance with the present invention.

FIG. 8A shows a MOSFET 800 having a substantially symmetric layout in accordance with an embodiment of the present invention. Similar to the MOSFET 400 of FIG. 4, MOSFET 800 is symmetric about the XY and YX axes. The MOSFET 800 comprises a drain 820 and source 830 comprising a plurality of pads $810_1$ to $810_5$ arranged about a YX-axis. The MOSFET 800 may have any number of drain pads, source pads, and gates, as desired. The MOSFET 800 comprises a plurality of gates 840 and a plurality of VIAs 850. The plurality of gates 840 lay on active areas 880. The gates 840 help to maximize the W/L ratio of the MOSFET 800 in order to provide higher driving currents, in accordance with Equation(1). The placement of the gates 840 in the MOSFET 800 also help to minimize the distance between drain and source pads $810_1$ to $810_5$ to the active areas 880, thereby reducing $R_{ON}$ and power dissipation. As desired, MOSFET 800 may be an NMOS or PMOS transistor. FIG. 8B shows a MOSFET 801 similar to MOSFET 800 except that the plurality of pads $810_1$ to $810_5$ are arranged about an KY-axis and the drain regions 820 are moved accordingly.

Figure 9A:
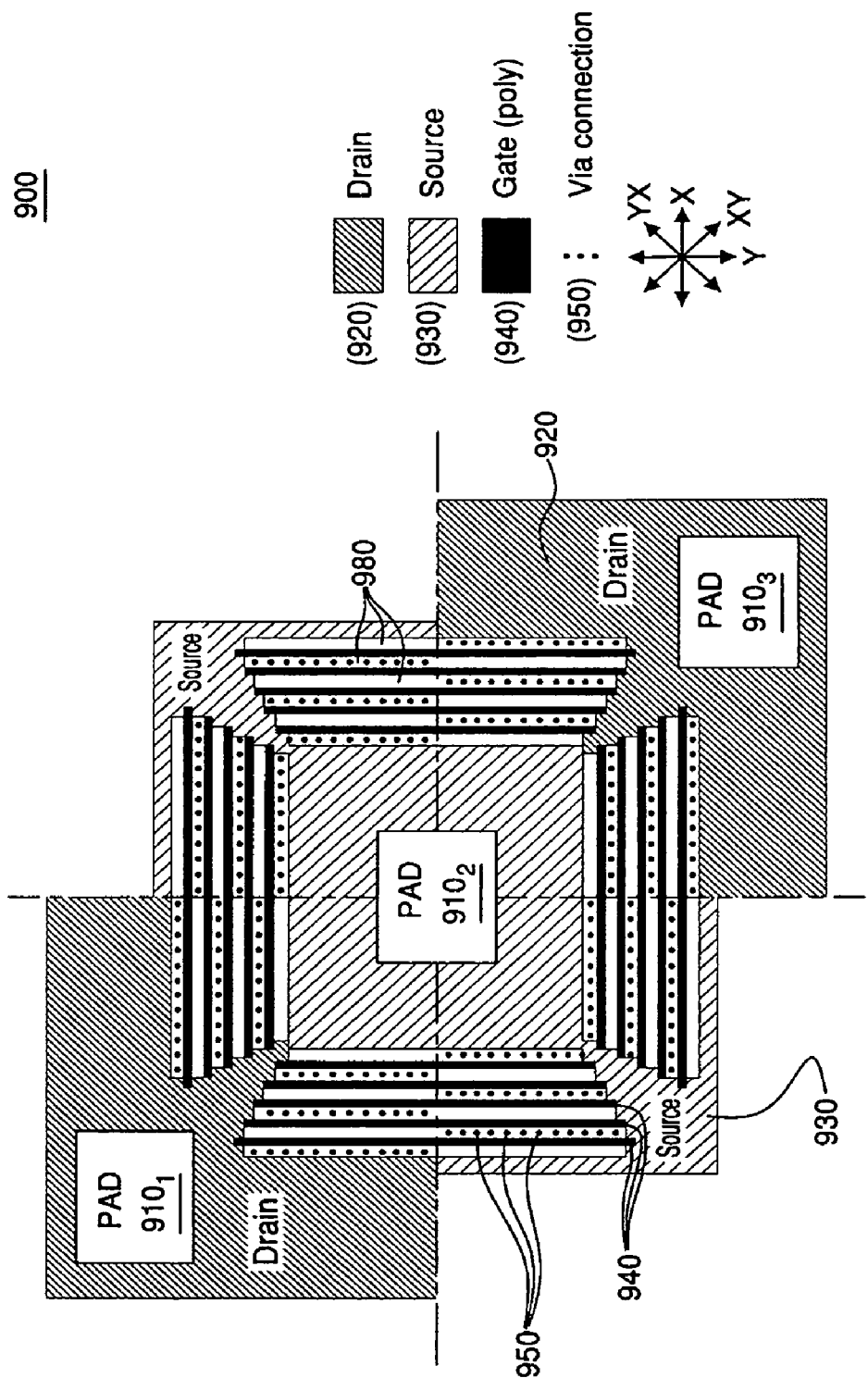
FIG. 9A is an embodiment of a MOSFET having a substantially symmetrical layout including a total of three drain and source pads arranged about the XY-axis and YX-axis in accordance with the present invention.
Figure 9B:
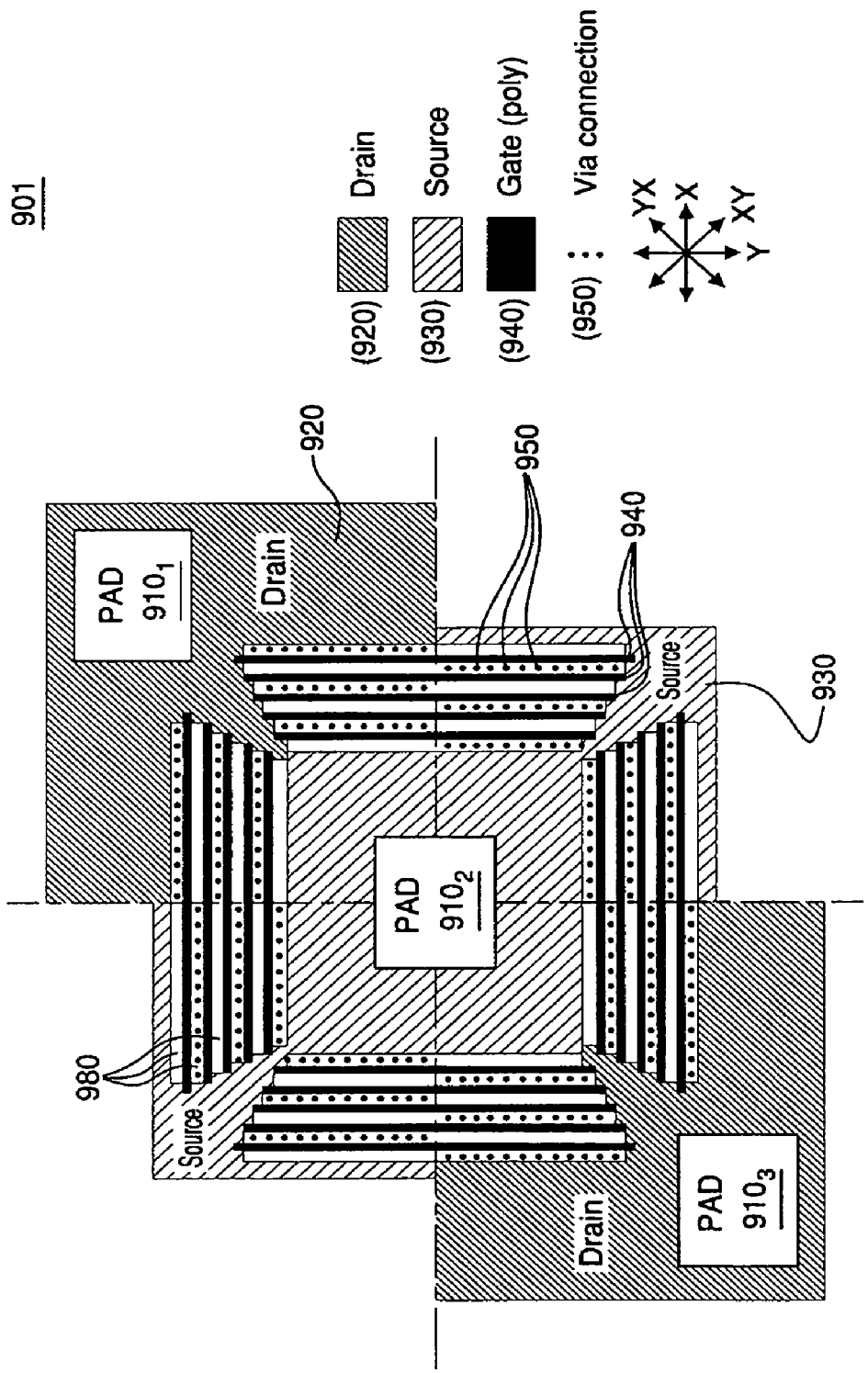
FIG. 9B is an embodiment of a MOSFET having a substantially symmetrical layout including a total of three drain and source pads arranged about the XY-axis and YX-axis in accordance with the present invention.

FIG. 9A shows a MOSFET 900 having a substantially symmetric layout in accordance with an embodiment of the present invention. Similar to the MOSFET 400 of FIG. 4, MOSFET 900 is symmetric about the XY and YX axes. The MOSFET 900 comprises a drain 920 and source 930 comprising a plurality of pads $910_1$ to $910_3$ arranged about an XY-axis. The MOSFET 900 may have any number of drain pads, source pads, and gates, as desired. The MOSFET 900 comprises a plurality of gates 940 and a plurality of VIAs 950. The plurality of gates 940 lay on active areas 980. The gates 940 help to maximize the W/L ratio of the MOSFET 900 in order to provide higher driving currents, in accordance with Equation(1). The placement of the gates 940 in the MOSFET also help to minimize the distance between drain and source pads $910_1$ to $910_3$ to the active areas 980, thereby reducing $R_{ON}$ and power dissipation. As desired, MOSFET 900 may be an NMOS or PMOS transistor. FIG. 9B shows a MOSFET 901 similar to MOSFET 900 except that the plurality of pads $910_1$ to $910_3$ are arranged about an YX-axis and the drain regions 920 are moved accordingly.

Figure 10A:
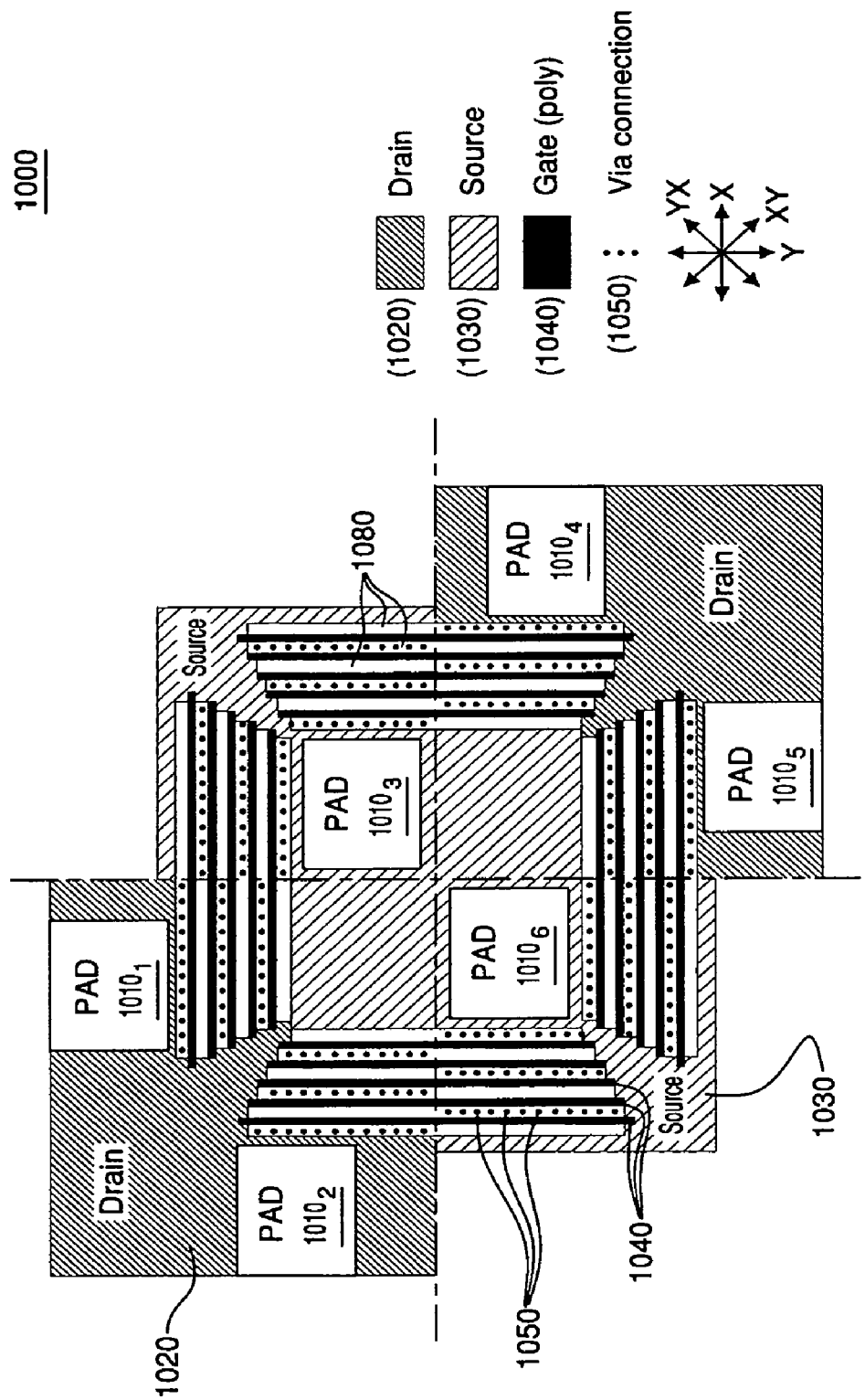
FIG. 10A is an embodiment of a MOSFET having a substantially symmetrical layout including a total of six drain and source pads arranged about the XY-axis and YX-axis in accordance with the present invention.
Figure 10B:
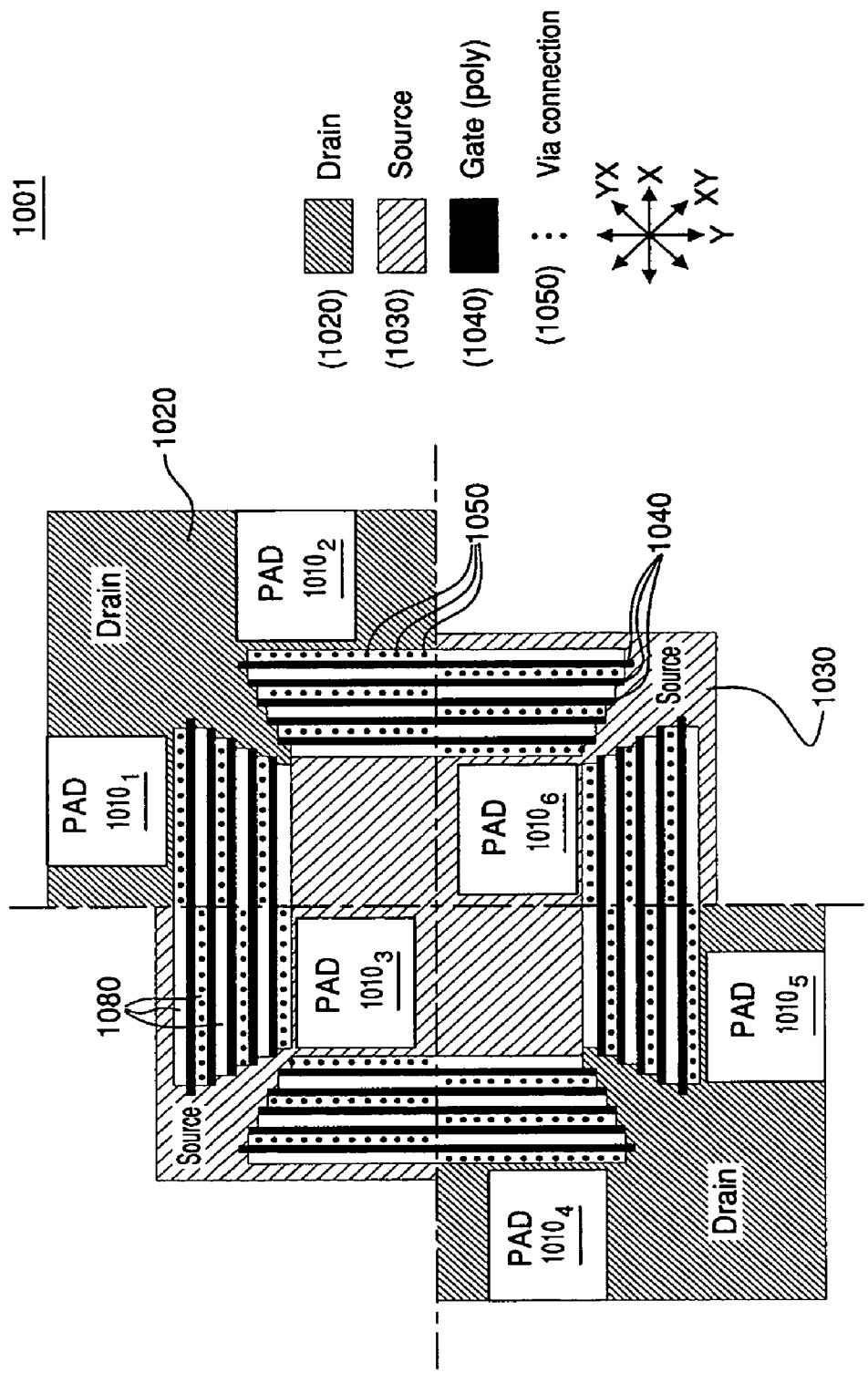
FIG. 10B is an embodiment of a MOSFET having a substantially symmetrical layout including a total of six drain and source pads arranged about the XY-axis and YX-axis in accordance with the present invention.

FIG. 10A shows a MOSFET 1000 having a substantially symmetric layout in accordance with an embodiment of the present invention. Similar to the MOSFET 400 of FIG. 4, MOSFET 1000 is symmetric about the XY and YX axes. The MOSFET 1000 comprises a drain 1020 and source 1030 comprising a plurality of pads 1010i to 10106 arranged about an XY-axis. The MOSFET 1000 may have any number of drain pads, source pads, and gates, as desired. The MOSFET 1000 comprises a plurality of gates 1040 and a plurality of VIAs 1050. The plurality of gates 1040 lay on active areas 1080. The gates 1040 help to maximize the W/L ratio of the MOSFET 1000 in order to provide higher driving currents, in accordance with Equation(1). The placement of the gates 1040 in the MOSFET also help to minimize the distance between drain and source pads $1010_1$ to $1010_6$ to the active areas 1080, thereby reducing $R_{ON}$ and power dissipation. As desired, MOSFET 1000 may be an NMOS or PMOS transistor. FIG. 10B shows a MOSFET 1001 similar to MOSFET 1000 except that the plurality of pads $1010_1$ to $1010_6$ are arranged about an YX-axis and the drain regions 1020 are moved accordingly.

It is noted that in the figures described herein drain and source regions are generally shown in particular quadrants within the MOSFET. For example, the drain regions are generally shown to be substantially outside of the trapezoidal gate areas while the source regions are generally shown to be substantially inside of the trapezoidal gate areas. It is noted however that the drain and source regions may be placed anywhere in the proximity of the gates. For example, the drain region may be on the inside of the trapezoidal gate areas and the source region may be on the outside of the trapezoidal gate areas.

Although the features and elements of the present invention are described in the preferred embodiments in particular combinations, each feature or element can be used alone without the other features and elements of the preferred embodiments or in various combinations with or without other features and elements of the present invention. It is noted that the teachings of the present invention may be implemented using software or hardware in any type of electronic device.

The invention claimed is:
1. A transistor, comprising:
a first plurality of gates arranged in a substantially trapezoidal arrangement;

a second plurality of gates arranged in a substantially trapezoidal arrangement;

a drain region in proximity to the first and second plurality of gates; and a source region in proximity to the first and second plurality of gates.

2. The transistor of claim 1, wherein at least part of the first plurality of gates and the second plurality of gates are substantially symmetrical with one another generally about an axis.

3. The transistor of claim 2, wherein the axis is an XY-axis.

4. The transistor of claim 1, wherein the drain region and the source region each comprises a plurality of pads.

5. The transistor of claim 4, wherein the plurality of pads of the drain region is equal in number to the plurality of pads of the source region.

6. The transistor of claim 5, wherein the plurality of drain pads and the plurality of source pads are arranged generally about an XY-axis.

7. The transistor of claim 4, wherein the drain region is substantially outside an area of the first and second substantially trapezoidal arrangements of the plurality of first gates and the plurality of second gates.

8. The transistor Of claim 7, wherein the source region is substantially inside the area of the first and second substantially trapezoidal arrangements of the first plurality of gates and the second plurality of gates.

9. The transistor of claim 1, wherein the first and second plurality of gates are arranged in a substantially isosceles trapezoidal arrangement.

10. The transistor of claim 1, wherein the first and second plurality of gates are arranged in an isosceles trapezoidal arrangement.

11. The transistor of claim 2, wherein the drain region is symmetrical about the axis.

12. The transistor of claim 2, wherein the source region is symmetrical about the axis, 13. The transistor of claim 4, wherein the plurality of pads of the drain region are substantially symmetrical about an axis.

14. A transistor comprising:
    a first plurality of gates arranged in a substantially trapezoidal arrangement;
    a second plurality of gates arranged in a substantially trapezoidal arrangement;
    a third plurality of gates arranged in a substantially trapezoidal arrangement;
    a fourth plurality of gates arranged in a substantially trapezoidal arrangement;
    a first region in proximity to the first and second substantially trapezoidal arrangements of the plurality of gates;
    a second region in proximity to the third and fourth substantially trapezoidal arrangements of the plurality of gates; and
    a third region in proximity to, and within an area substantially defined by, the first, second, third and fourth substantially trapezoidal arrangements of the plurality of gates.

15. The transistor of claim 14, wherein the first region and the second region are drain regions and the third region is a source region.

16. The transistor of claim 14, wherein the first region and the second region are source regions and the third region is a drain region.

17. The transistor of claim 14, wherein the first region and the second region include a plurality of drain pads arranged about an axis.

18. The transistor of claim 17, wherein the second region includes a plurality of source pads arranged about an axis.

19. The transistor of claim 18, wherein the axis is an XY-axis.

20. The transistor of claim 18, wherein the axis is an YX-axis.

* * * * *

UNITED STATES PATENT AND TRADEMARK OFFICE
CERTIFICATE OF CORRECTION

| | | |
|---|---|---|
| PATENT NO. | : 8,148,754 B2 | Page 1 of 1 |
| APPLICATION NO. | : 12/135956 | |
| DATED | : April 3, 2012 | |
| INVENTOR(S) | : Pierrel et al. | |

It is certified that error appears in the above-identified patent and that said Letters Patent is hereby corrected as shown below:

Column 7, line 24, delete "Of" and insert -- of --

Column 7, line 38, delete "axis," and insert -- axis. --

Signed and Sealed this
Twenty-second Day of May, 2012

David J. Kappos
*Director of the United States Patent and Trademark Office*

UNITED STATES PATENT AND TRADEMARK OFFICE
CERTIFICATE OF CORRECTION

PATENT NO. : 8,148,754 B2  
APPLICATION NO. : 12/135956  
DATED : April 3, 2012  
INVENTOR(S) : Pierrel et al.

It is certified that error appears in the above-identified patent and that said Letters Patent is hereby corrected as shown below:

Column 4, line 40, delete "RON" and insert -- $R_{ON}$ --

Column 4, line 64, delete "610" and insert -- 510 --

Column 5, line 12, delete "RON" and insert -- $R_{ON}$ --

Column 6, line 1, delete "KY-axis" and insert -- XY-axis --

Column 6, line 28, delete "1010i to 10106" and insert -- $1010_1$ to $1010_6$ --

Signed and Sealed this  
Thirty-first Day of July, 2012

David J. Kappos  
*Director of the United States Patent and Trademark Office*